(12) United States Patent
Micheloni et al.

(10) Patent No.: US 6,351,413 B1
(45) Date of Patent: Feb. 26, 2002

(54) NONVOLATILE MEMORY DEVICE, IN PARTICULAR A FLASH-EEPROM

(75) Inventors: Rino Micheloni, Turate; Giovanni Campardo, Bergamo; Stefano Commodaro, Cassina de'Pecchi; Francesco Farina, Fermo, all of (IT)

(73) Assignee: STMicroelectronics S.rll., Agrate Brianza (IT)

( * ) Notice: Subject to any disclaimer, the term of this patent is extended or adjusted under 35 U.S.C. 154(b) by 0 days.

(21) Appl. No.: 09/552,945

(22) Filed: Apr. 20, 2000

(30) Foreign Application Priority Data

Apr. 21, 1999 (EP) .............................. 99830236

(51) Int. Cl.⁷ .............................................. G11C 16/04
(52) U.S. Cl. ............................... 365/185.11; 365/185.13
(58) Field of Search ....................... 365/185.11, 185.23, 365/185.33

(56) References Cited

U.S. PATENT DOCUMENTS

| | | | |
|---|---|---|---|
| 5,663,903 A | 9/1997 | Guo | 365/104 |
| 5,717,636 A | * 2/1998 | Dallabora et al. | 365/185.11 |
| 5,748,528 A | * 5/1998 | Campardo et al. | 365/185.11 |
| 5,854,770 A | 12/1998 | Pascucci | 365/230.3 |
| 5,896,340 A | * 4/1999 | Wong et al. | 365/230.03 |
| 6,064,623 A | * 5/2000 | Ha | 365/185.33 |

FOREIGN PATENT DOCUMENTS

EP    0 834 881 A1    4/1996

OTHER PUBLICATIONS

Chen, T. et al.: "Optimization of the No. 1, 2 of Levels of Hierarchy in Large–Scale Hierarchical Memory Systems," Proceedings of the International Symposium on Circuits and Systems, San Diego, May 10–13, 1992, vol. 5 No. CONF. 25, May 10, 1992 (May 10, 1992), pp. 2104–2107.

* cited by examiner

*Primary Examiner*—Trong Phan
(74) *Attorney, Agent, or Firm*—Lisa Jorgenson; Robert Iannucci; Seed Ip Law Group, PLLC (57) ABSTRACT

The memory array comprises a plurality of cells, grouped together in sectors and arranged in sector rows and columns, and has both hierarchical row decoding and hierarchical column decoding. Global word lines are connected to at least two word lines in each sector, through local row decoders; global bit lines are connected to at least two local bit lines in each sector, through local column decoders. The global column decoder is arranged in the center of the memory array, and separates from each other an upper half and a lower half of the memory array. Sense amplifiers are also arranged in the middle of the array, thus saving space. This architecture also provides lesser stress of the cells, better reliability, and better production performance. In addition, each sector is completely disconnected from the remaining sectors, and only the faulty row or column of a single sector should be doubled.

16 Claims, 6 Drawing Sheets

NONVOLATILE MEMORY DEVICE, IN PARTICULAR A FLASH-EEPROM

TECHNICAL FIELD

The present invention relates to a nonvolatile memory device, in particular a flash-EEPROM.

BACKGROUND OF THE INVENTION

As known, memory arrays comprise a plurality of cells arranged on rows and columns, and each memory cell is identified by an own address, which, decoded, unambiguously addresses and biases the row and the column of the cell, so that the cell can be read and written. In general, the rows are known as word lines, and the columns are known as bit lines. In some cases a further subdivision in global lines and local lines is necessary; therefore local lines or columns connected directly to the cell to be addressed (to be read or written), are grouped in packets formed by a number of lines, usually a power of two, and are connected by respective selection circuits to a global line, addressed by a global decoder.

In general, standard decoding is an addressing system wherein the word or bit lines are of the same level to each other and are not organized hierarchically, and hierarchical decoding is an addressing system comprising global lines and local lines.

In flash memories, a further division into sectors is necessary (each sector being a block of cells having a common terminal and comprising an equal number of rows and columns), for which erasing is carried out. To avoid stress phenomena, detrimental to the cells, it is necessary to electrically isolate the various sectors to apply the high voltages (for example, voltages necessary for programming and erasing, and, for multi-level memories, also for reading), only to the selected sector. This division is dependent on the adopted erasing method, and two cases in particular can be distinguished:

erasing by the source terminal, with the gate terminal grounded: in this case the sectors are organized by columns, and the row is shared. This solution has the disadvantage that the cells not to be programmed, but connected to the row of the cell to be written, are subjected to gate stress during the programming; and erasing by applying a negative voltage to the gate region; in this case, two different decoding types are possible, i.e., hierarchical column decoding, and hierarchical row decoding.

Figure 1:
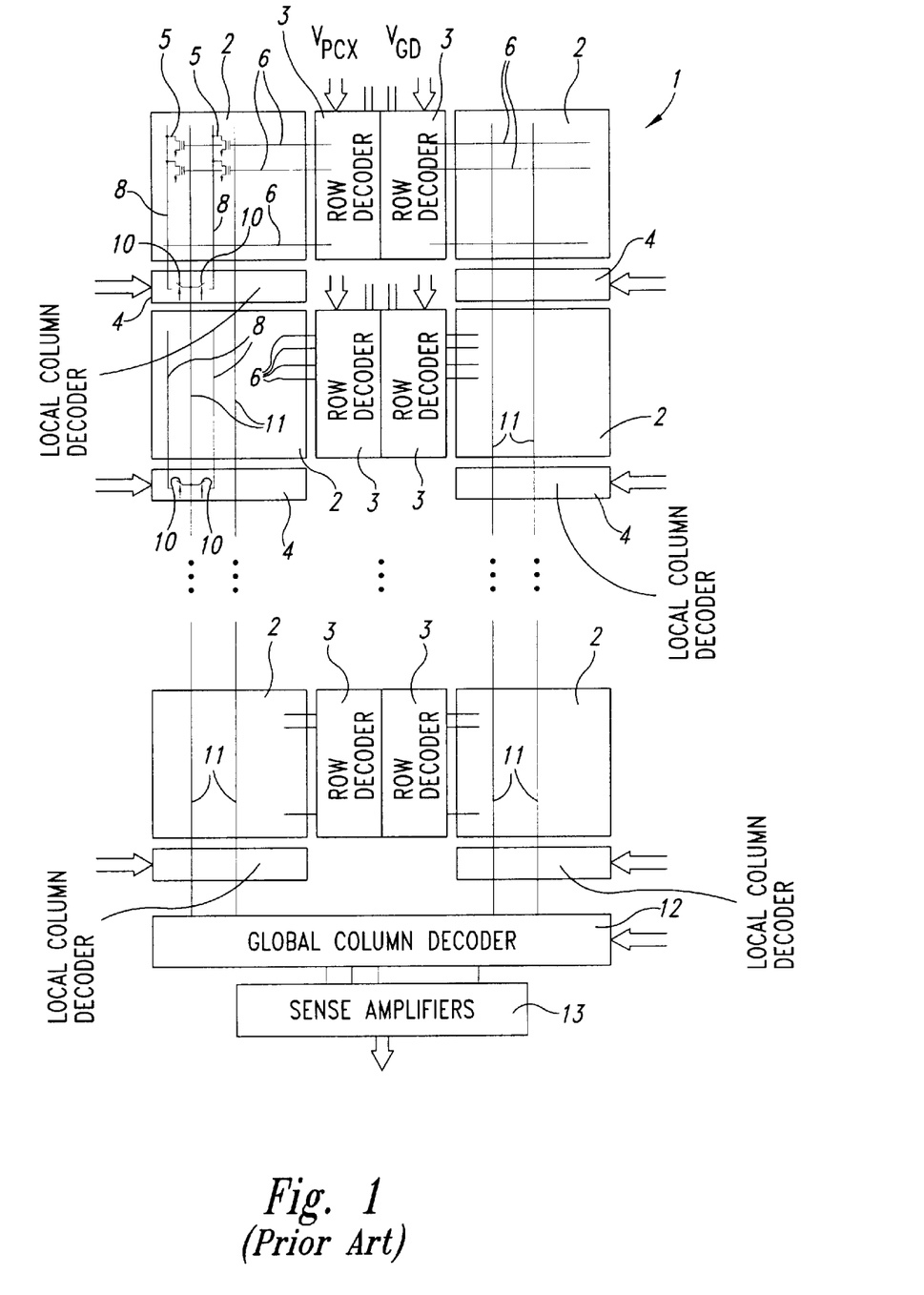
FIG. 1 shows a first, known architecture of a memory array.
Figure 2:
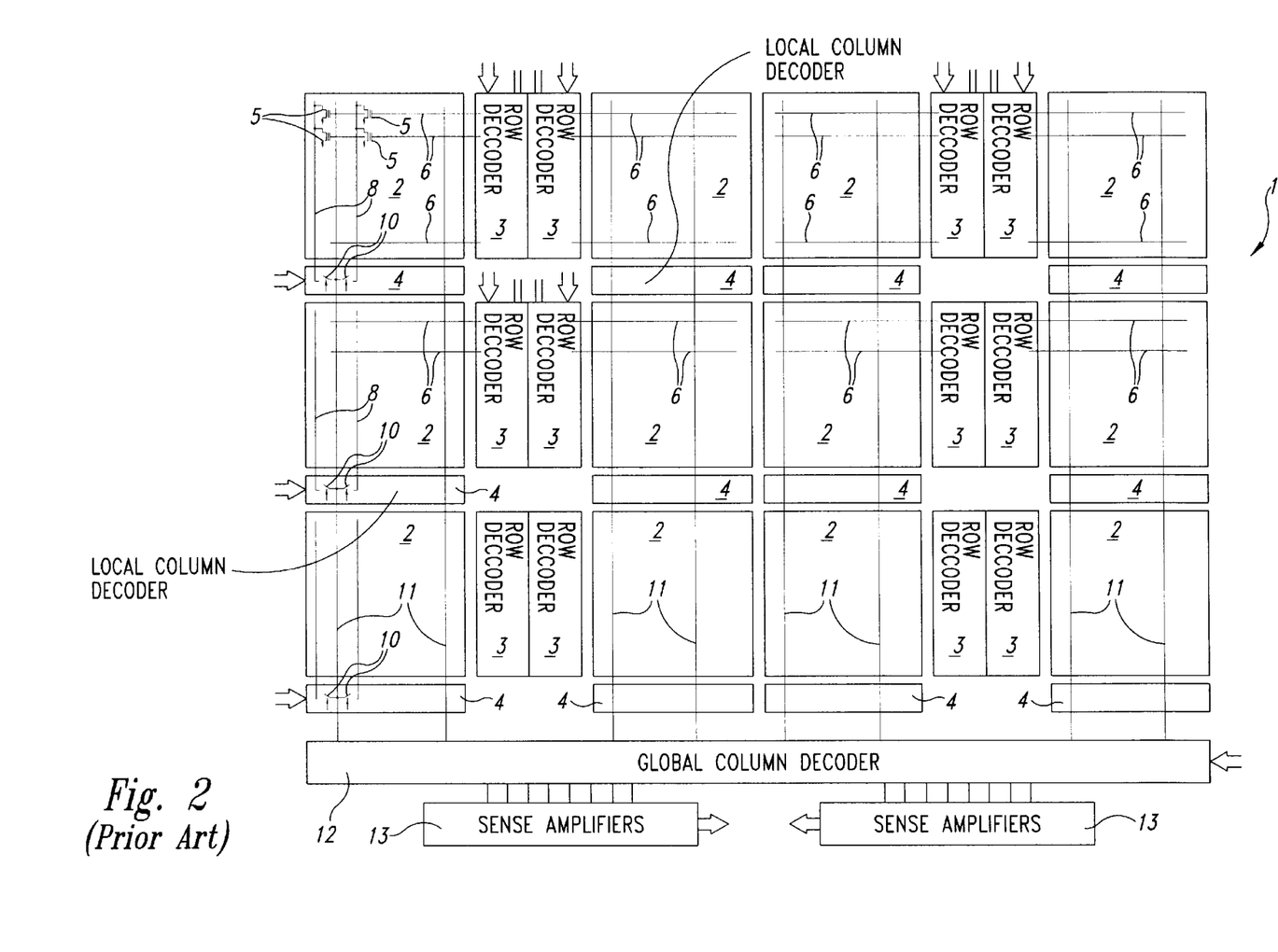
FIG. 2 shows a second, known architecture of a memory array.

Two examples of hierarchical (vertical) column decoding are shown in FIGS. 1 and 2, wherein row decoding is standard and the column decoding is hierarchical.

In detail, FIG. 1 shows a memory array 1, comprising a plurality of sectors 2, arranged on two columns separated from each other by two pairs of row decoders 3, for the right- and left-hand sectors respectively. A respective column decoder 4 is arranged below each sector 2. Each sector 2 comprises a plurality of memory cells 5, shown partially only for one sector 2.

In turn, the memory cells 5 are arranged on rows and columns; in particular the memory cells 5 arranged on a same row and belonging to a same sector 2 are connected to a same word line 6, which extends along the entire width of each sector, from the respective row decoder 3. In addition, the memory cells 5 arranged on a same column and belonging to a same sector 2 are connected to a same local bit line 8, which extends along the entire height of each sector 2, from the respective local column decoder 4. Adjacent pairs of local bit lines 8 belonging to a same sector 2 are connected, through respective switches 10, for example formed by pass transistors, to a same global bit line 11; each global bit line extends along the entire respective sector column and is connected to pairs of local bit lines 8 belonging to vertically aligned sectors 2. The global bit lines 11 are connected to a global column decoding circuit 12, in turn connected to a reading stage 13 (comprising a plurality of sense amplifiers, not shown). The row decoders 3, the local column decoders 4, and the global column decoder 12, receive respective address and control signals, and the bias voltages required at respective inputs, as shown in FIG. 1.

The solution in FIG. 1 can be used if the number of sectors is not too high, and does not alter excessively the shape of the array, here an elongate rectangle. In case of a large number of sectors, it is possible to use the solution of FIG. 2.

FIG. 2 shows a memory array 1', comprising a plurality of sectors 2, arranged on four columns and a plurality of rows. In particular, two row decoders 3 are arranged between each pair of sectors 2. In memory array 1', it is necessary to double the number of reading circuits, as shown in the Figure by two reading stages 13. As an alternative, it is possible to introduce an additional multiplexing level. Otherwise, the memory array 1' in FIG. 2 is similar to those in FIG. 1.

In the hierarchical column decoding just described, the length of the rows and columns cannot be long, thus limiting the number and dimensions of the sectors to be provided. In fact, a long column call cause leakage, whereas the length of the row affects the access time, due to the equivalent time constant RC of the word lines. However, the solutions designed to solve this problem are affected in turn by further problems. For example, to reduce the problem of the biasing delay in case of long word lines, it has been proposed to arrange, in parallel with each polysilicon word line, a metal line, connected at various points to the actual word line (metal strap technique). This solution makes it possible to reduce the resistance of the word lines, but reduces the reliability of the memory, since it increases the risk of short-circuiting between the metal lines, which must be arranged along the path of the row, i.e., along its width.

In addition, in case of hierarchical column decoding, the problem exists that the row decoders occupy a large area, and the memory array as a whole becomes voluminous.

In case of hierarchical row decoding, the situation is inverse, i.e., the column decoding is standard, and row decoding is hierarchical. An embodiment of a memory array with hierarchical row decoding is shown in FIG. 3.

Figure 3:
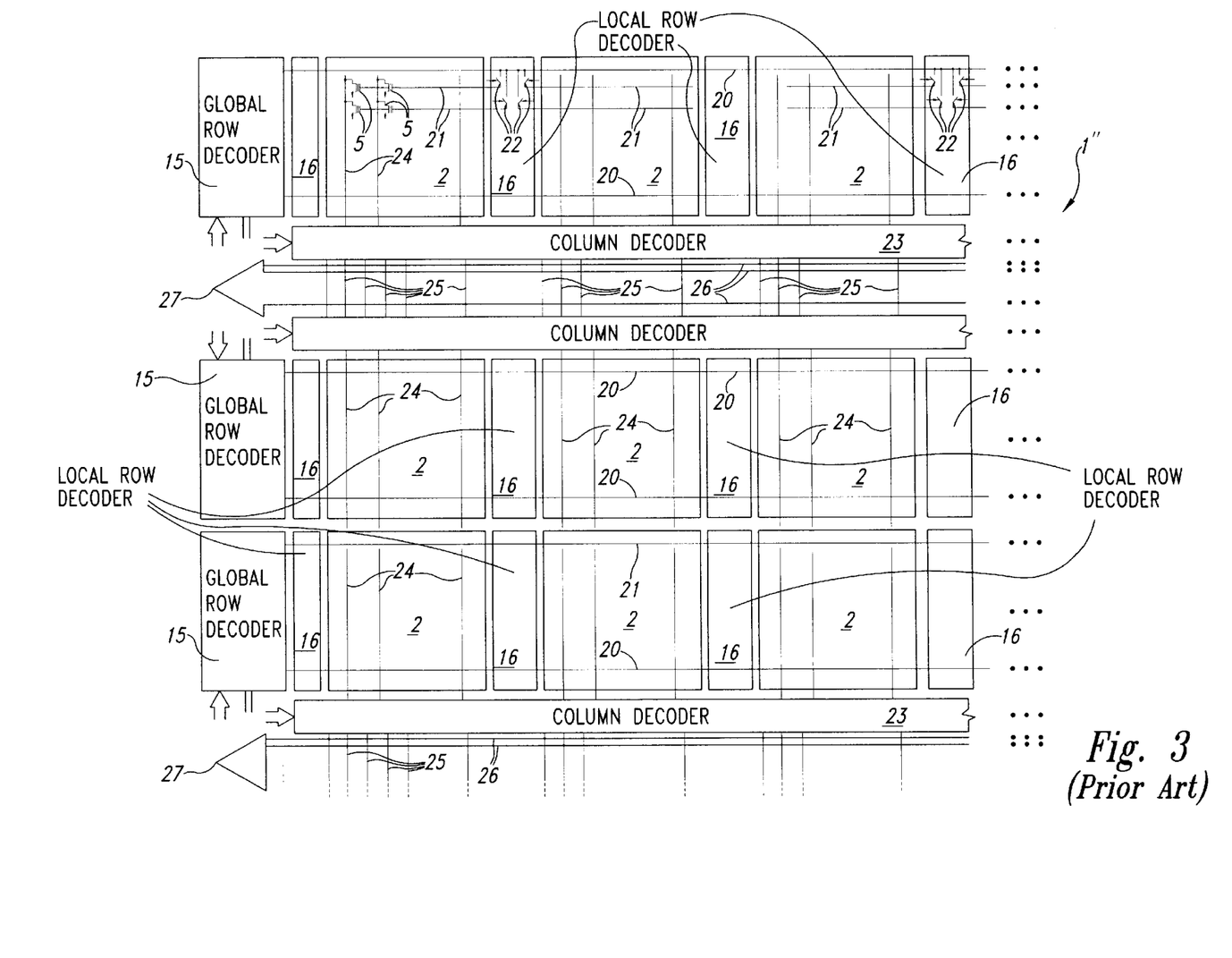
FIG. 3 shows a third, known architecture of a memory array.

In detail, FIG. 3 shows a memory array 1" comprising a plurality of sectors 2, arranged on a plurality of rows and a plurality of columns, for example on four rows and eight columns, only some whereof are shown in FIG. 3. Each sector row is associated to a global row decoder 15, and each sector 2 is associated to a local row decoder 16, which is divided into two parts, arranged respectively to the left and right of each sector 2; in FIG. 3, the local row half-decoder 16, arranged to the right of a sector 2, forms a unit with the local row half-decoder 16 arranged to the left of the sector 2 adjacent on the right.

A plurality of global word lines 20 extends from each global row decoder 15 along the entire width of the memory array 1", i.e., along the entire row; each global word line 20, formed by a metal line, is thus connected to a plurality of polysilicon local word lines 21; in the example illustrated, for each sector 2, two local word lines 21 are connected to a same global word line 20, through a respective switch 22, for example comprising a pass transistor.

Each row of sectors 2 is associated to a respective column decoder 23, arranged alternately below and above the sector row; metal bit lines 24 extend from the column decoders 23 and are connected to the drain terminals of the memory cells 5. Adjacent column decoders 23 have first common output lines 25, connected to second output lines 26 and leading to a reading stage 27.

Similarly to the above, the global row decoders 15, the local row decoders 16 and the column decoders 23 receive respective address and control signals and the required bias voltages at the respective inputs, as shown in FIG. 3.

The hierarchical row decoding shown in FIG. 3 has disadvantages similar to those previously described for the hierarchical column decoding, i.e., the bit lines 24, the length of which is determined by the height (number of rows) of the sector, and the local word lines 21, the length of which is determined by the width (number of columns) of the sector, can be very long, and can cause leakages and long access times. Further disadvantages of this solution are because two channels (group of output lines 26) are present and convey the output signals to the reading stages 27, and four column decoders 23 are necessary. Consequently, this solution requires a large area. To eliminate this problem, it is possible to use a single central channel; however, here, the load of the bit lines 24 is doubled, which, in very large memories, can produce an unacceptable delay in loading and discharging the bit lines 24; in addition, leakages associated with the bit lines 24 increase, and the drain stress is greater. It is possible to reduce loading only suing a further column decoding level; however, this further level is critical, since it causes a greater voltage drop at the drain terminal of the cells 5. Another problem with hierarchical row decoding consists in the fact that the reading circuits 27 must be doubled, or require multiplexing.

SUMMARY OF THE INVENTION

An embodiment of the invention provides a different architecture for a nonvolatile memory, which eliminates the above described problems of the known solutions. The memory device includes a memory array that comprises a plurality of cells, grouped together in sectors and arranged in sector rows and columns, and has both hierarchical row decoding and hierarchical column decoding. Global word lines are connected to at least two word lines in each sector, through local row decoders; global bit lines are connected to at least two local bit lines in each sector, through local column decoders. The global column decoder is arranged in the center of the memory array, and separates from each other an upper half and a lower half of the memory array. Sense amplifiers are also arranged in the middle of the array, thus saving space. This architecture also provides lesser stress of the cells, better reliability, and better production performance. In addition, each sector is completely disconnected from the remaining sectors, such that only a faulty row or column of a single sector need be replace with a redundant row or column for that sector.

BRIEF DESCRIPTION OF THE DRAWINGS

To help understanding of the present invention, a preferred embodiment is now described, purely by way of non-limiting example, with reference to the attached drawings, wherein.

DETAILED DESCRIPTION

Figure 4A:
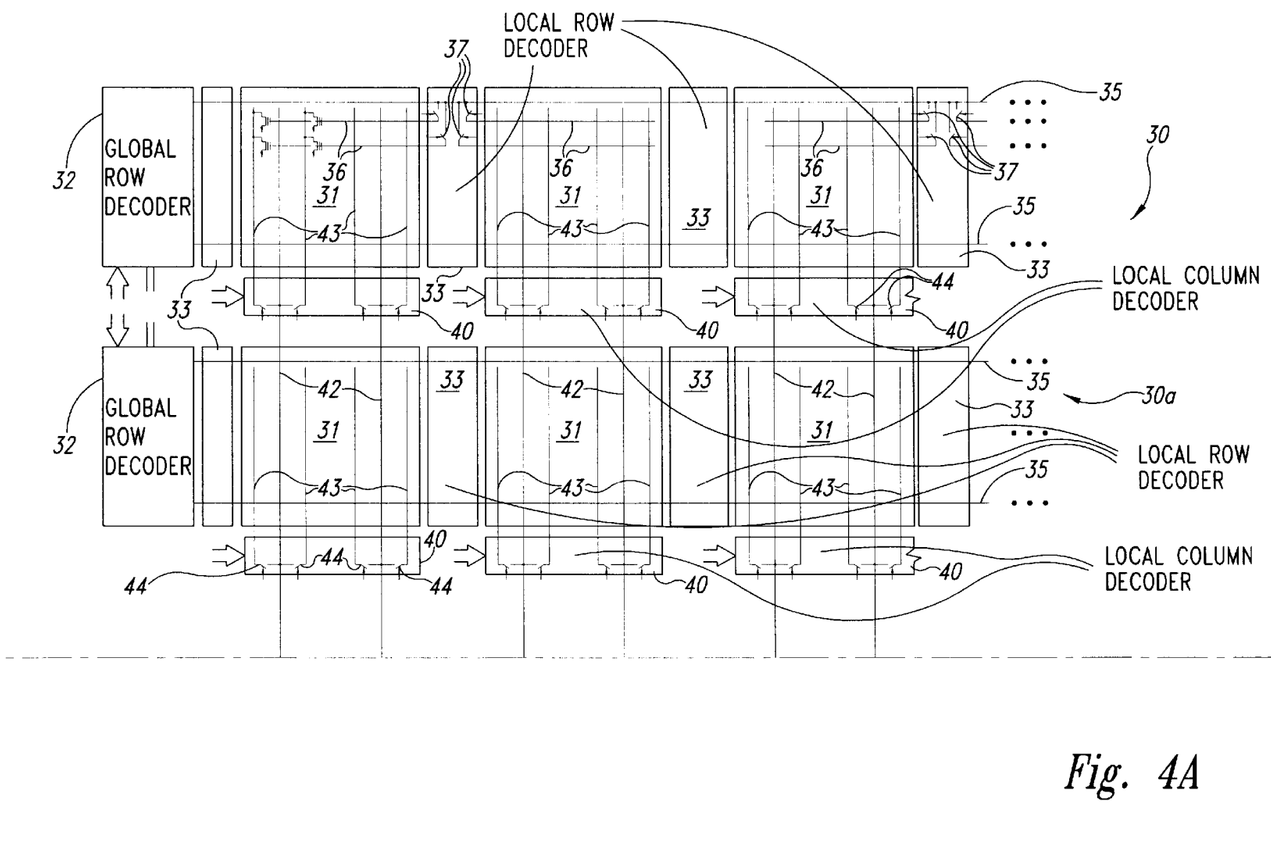
FIG. 4 shows the architecture of a memory array according to the present invention.
Figure 4B:
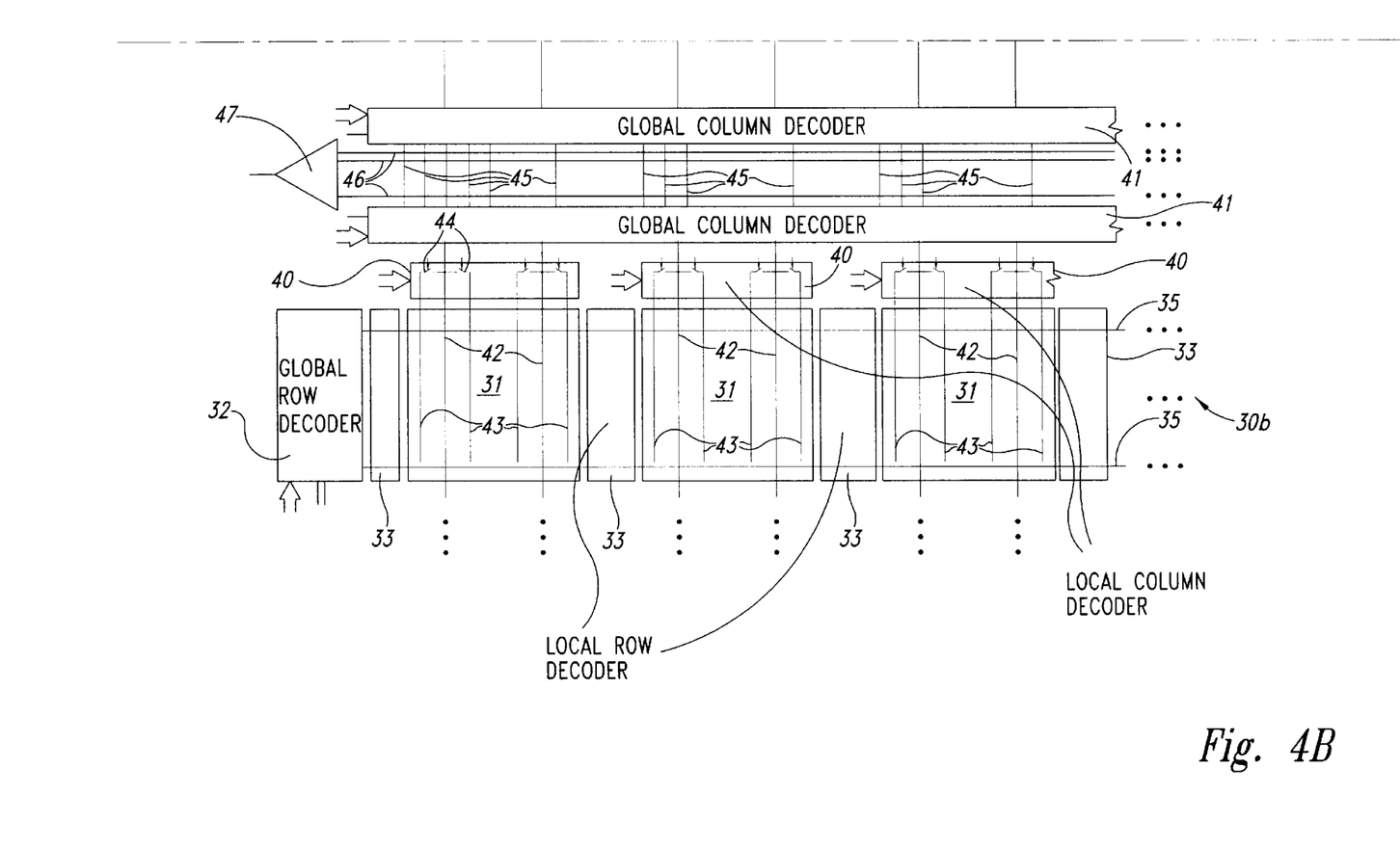

FIG. 4 shows a memory array 30 according to the invention. The memory array 30 comprises a plurality of sectors 31 arranged on a plurality of rows and on a plurality of columns, for example on four rows and eight columns (only some of which are shown in FIG. 4). In turn, the sectors 31 comprise groups of memory cells 50 of flash-EEPROM type, having a common source terminal (here shown connected to ground). Each sector row is associated to a global row decoder 32 and each sector 31 is associated to a local row decoder 33; the row decoder 33 is divided into two parts, arranged respectively to the left and to the right of each sector 2; in FIG. 4, the local row half-decoder 33, arranged to the right of a sector 31, forms a unit with the local row half-decoder 33, arranged to the left of the sector 31 adjacent on the right.

A plurality of global word lines 35 extends from each global row decoder 32 along the entire width of the memory array 30, i.e., along the entire row; each global word line 35 is thus connected to a plurality of local word lines 36, two in the example illustrated, but typically four local word lines 36 for each sector 31, through respective switches 37, for example formed by pass transistors. As visible, the local word lines 36 connected to a same global word line 35 are aligned to each other on two rows.

Each sector 31 is associated to a respective local column decoder 40, in turn connected to a global column decoder 41, arranged horizontally in the center of the memory array 30. In detail, two pluralities of global bit lines 42 extend from the global column decoder 41, shown divided into two parts for illustration, i.e., a first plurality extends from the global column decoder 41 towards the upper half of the memory array 30 (indicated at 30a), and a second plurality extends from the global column decoder 41 towards the lower half of the memory array 30 (indicated at 30b). Each global bit line 42 is connected to two local bit lines 43 for each sector 31, through respective switches 44, for example comprising pass transistors. As visible, the local bit lines 43 connected to a same global bit line 42 are aligned to each other on two columns. Similarly, the global bit lines 42 extending towards the upper half 30a and towards the lower half 30b of the memory array 30 are aligned to each other, and the respective local bit lines 43 are aligned along the columns of the memory array.

The global column decoder 41 has first output lines 45 connected to second output lines 46, leading to a reading stage 47, comprising a plurality of reading circuits (sense amplifiers), not shown, in a known manner.

As shown schematically in FIG. 4, the global row decoders 32, the local row decoders 33, the global column decoder 41 and the local column decoders 40 receive respective address and control signals, and the required bias voltage at the respective inputs.

Figure 5:
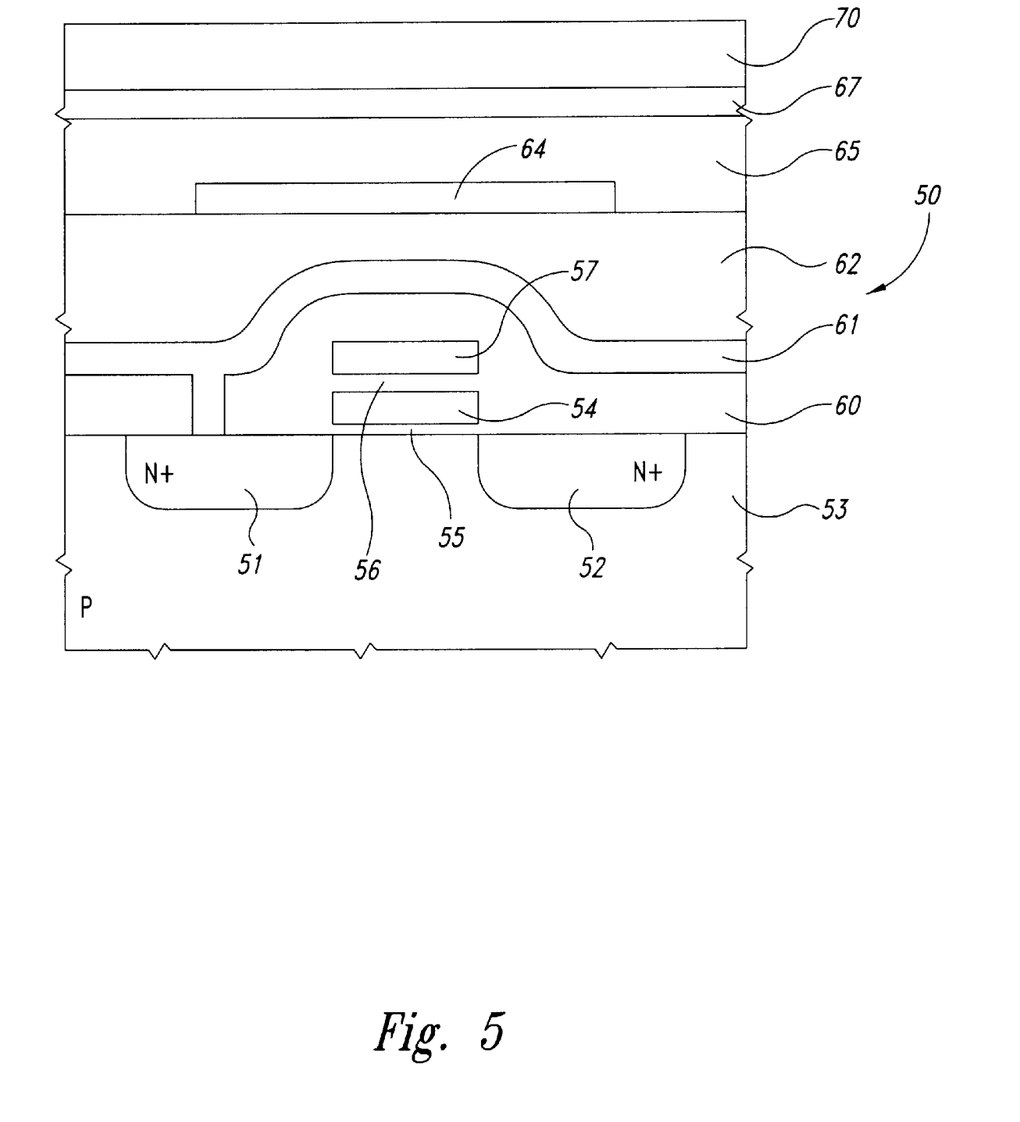
FIG. 5 shows a cross-section through a memory cell belonging to the array of FIG. 4.

For manufacturing the memory 30, a process with three metal layers is used, as shown schematically in FIG. 5, showing a cross-section of a memory cell 50. In detail, the cell 50 comprises a drain region 51 and a source region 52, housed in a substrate 53. A floating gate region 54 is formed above the substrate 53 and is insulated from the substrate 53 by a gate oxide layer 55; a polysilicon layer 57 extends above the floating gate region 54 and isolated therefrom by a dielectric layer 56, the polysilicon layer 57 forms a control gate region for the cell 50 and a local word line 36 (FIG. 4). A first dielectric layer 60 covers the substrate 53 and the polysilicon line 57. A first metal line 61, forming a local bit line 43 (FIG. 4), extends above the first dielectric layer 60, and electrically contacts the drain region 51. A second dielectric layer 62 extends above the first dielectric layer 60 and the first metal line 61. A second metal line 64, visible only in cross-section in FIG. 5 and forming a global word line 35 (FIG. 4), extends above the second dielectric layer 62, and is electrically connected to the local word line 36 through a switch 37 (not shown in FIG. 5, as schematically illustrated in FIG. 4). A third dielectric layer 65 extends above the second dielectric layer 62 and the second metal line 64. A third metal line 67, forming a global bit line 42, extends above the third dielectric layer 65 and is electrically connected to the first metal line 61 through a switch 44 (not shown in FIG. 5, as schematically illustrated in FIG. 4). A passivation layer 70 covers the entire device.

The architecture in FIG. 4 thus uses double hierarchical decoding, both of rows and columns. This solution has many advantages. First, the architecture is more compact, since cell reading requires only a single, central channel; this arrangement reduces the bulk and this reduction is only partially balanced by the need to provide local column decoding circuits.

The reading stages 47 can be arranged in the central area of the memory array 30, instead of to the right or to the left of the latter, thus contributing to reduction of area.

The memory array 30 is subjected to less stress during access to the memory cells, since the not addressed sectors are disconnected completely from the addressed sector.

The metal line forming the global word line 35 no longer needs to be arranged between the rows, since each global word line 35 is connected to more than one row (to two rows, in the example shown), and each row is addressed by a polysilicon line (line 57 in FIG. 5). Thereby, the reliability of the device and the production performance are increased; the line time constant is acceptable, since the length of the local (polysilicon) word lines 36 is limited to that of the sector.

Each sector 31 is completely disconnected from the others, both horizontally and vertically. Thereby it is possible to completely decouple the faulty sectors or individual lines (rows or columns), and to replace them completely by redundancy sectors or rows, thus overcoming the limitations imposed by the present solutions for redundancy of rows and/or columns. Indeed, in the present architectures, for example in hierarchical column decoding, the presence of a faulty row causes redundancy of all the equivalent rows in the adjacent sectors.

The possibility of arranging the reading stages 47 in the central channel, rather than at the end of the array, reduces the capacitance of the bit lines, and is the more advantageous, the more reading stages 47 are used; in particular, in case of burst devices (in which several words are read in parallel), an architecture of this type is highly advantageous. This solution can advantageously be applied in particular with large size memories, which have many small sectors, since specifically in that case complete division of the memory array is necessary.

Finally, it is apparent that many modifications and variations can be made to the described and illustrated memory device, all of which come within the scope of the invention, as defined in the attached claims. In particular, the same solution of double hierarchical decoding can be applied not only to the case of row and column decoding, but also to the case of biasing the well accommodating each sector (ip-well or insulated p-well), and all the parts to be biased in an independent manner, when any operation is carried out on a sector.

In addition, although FIG. 4 shows a plurality of global row decoders 32, one for each sector row, this arrangement is equivalent to the use of a single global row decoder connected to all the global word lines; similarly, each local row decoder 33 associated with each sector 31 can be provided on a single side of the respective sector, if allowed by the spaces and the layout of the device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A nonvolatile memory device, comprising a memory array including a plurality of cells grouped into sectors and arranged on sector rows and columns, each of the sectors being a smallest portion of the memory array that is individually erasable, wherein said memory array has an own width and an own height, and each sector has an own width and an own height, the device further comprising:
   a global row decoder and a global column decoder;
   a plurality of global word lines, extending substantially along the entire width of said memory array from said global row decoder;
   a plurality of global bit lines extending along a plurality of sectors, in a height direction of said memory array from said global column decoder;
   a plurality of local row decoders respectively associated with the sectors such that each sector is uniquely associated with a respective one of the local row decoders;
   a plurality of local column decoders respectively associated with the sectors such that each sector is uniquely associated with a respective one of the local row decoders;
   wherein each of the sectors includes a plurality of local word lines extending substantially along the entire width of the sector from the local row decoder associated with the sector; and a plurality of local bit lines extending substantially along the entire height of the sector from the local bit decoder associated with the sector; and
   each global word line being connected to a plurality of the local word lines that are aligned with each other; and each global bit line being connected to a plurality of the local bit lines that are aligned with each other.

2. A device according to claim 1, wherein each global word line is connected to at least two local word lines for each sector, the local word lines of adjacent sectors connected to a same global word line being aligned along at least two adjacent rows of cells.

3. A device according to claim 1, wherein each global bit line is connected to at least two local bit lines for each sector, the local bit lines of adjacent sectors connected to a same global bit line being aligned along at least two adjacent columns of cells.

4. A device according to claim 1, wherein said global column decoder is arranged centrally to said memory array and separates from each other an upper half and a lower half of said memory array.

5. A device according to claim 4, wherein a first plurality of the global bit lines extends in said upper half, and a second plurality of the global bit lines extends in said lower half of said memory array; each global bit line of said first plurality of global bit lines being aligned with a respective global bit line of said second plurality of global bit lines; and said local bit lines connected to said global bit lines of said first and second plurality being aligned with each other along columns of cells.

6. A device according to claim 4 or claim 5, further comprising a reading stage arranged centrally inside said memory array, between said upper half and said lower half of said memory array.

7. A device according to claim 1, wherein said local bit lines are defined by a lower metal layer, said global word lines are defined by an intermediate metal layer, and said global bit lines are defined by an upper metal layer, said global bit lines each being positioned directly above a respective one of the local bit lines.

8. A nonvolatile memory device, comprising:
a memory array including a plurality of memory cells arranged in rows and columns;
a global row decoder;
a global column decoder;
a plurality of global word lines extending along the rows the memory array from the global row decoder;
a plurality of global bit lines extending along the columns of the memory array from the global column decoder;
a local row decoder positioned immediately adjacent to the global row decoder;
a local column decoder positioned immediately adjacent to the global column decoder;
a plurality of local word lines extending along subrows of the memory array from the local row decoder, the local row decoder selectively connecting the local word lines to a respective one of the global word lines and being positioned between the global row decoder and all of the local word lines; and
a plurality of local bit lines extending along subcolumns of the memory array from the local column decoder, the local column decoder selectively connecting the local bit lines to a respective one of the global bit lines and being positioned between the global column decoder and all of the local bit lines.

9. A device according to claim 8 wherein the memory array is divided into sectors and each global word line is connected to at least two local word lines for each sector, the local word lines of adjacent sectors connected to a same global word line being aligned along at least two adjacent rows of cells.

10. A device according to claim 9 wherein each global bit line is connected to at least two local bit lines for each sector, the local bit lines of adjacent sectors connected to a same global bit line being aligned along at least two adjacent columns of cells.

11. A device according to claim 8 wherein the global column decoder is arranged centrally to the memory array and separates from each other an upper half and a lower half of the memory array.

12. A device according to claim 11 wherein a first plurality of the global bit lines extends in the upper half, and a second plurality of the global bit lines extends in the lower half of the memory array; each global bit line of the first plurality of global bit lines being aligned with a respective global bit line of the second plurality of global bit lines; and the local bit lines connected to the global bit lines of the first and second plurality being aligned with each other along columns of cells.

13. A device according to claim 11, further comprising a reading stage arranged centrally inside the memory array, between the upper half and the lower half of the memory array.

14. A nonvolatile memory device, comprising:
a memory array including a plurality of memory cells arranged in rows and columns;
a global row decoder;
a global column decoder;
a plurality of global word lines extending along the rows the memory array from the global row decoder;
a plurality of global bit lines extending along the columns of the memory array from the global column decoder;
a local row decoder;
a local column decoder;
a plurality of local word lines extending along subrows of the memory array from the local row decoder, the local row decoder selectively connecting the local word lines to a respective one of the global word lines; and
a plurality of local bit lines extending along subcolumns of the memory array from the local column decoder, the local column decoder selectively connecting the local bit lines to a respective one of the global bit lines, wherein one of the local bit lines and one of the global bit lines are formed from first and second conductive lines positioned directly above one another with a first dielectric layer positioned between the conductive lines.

15. The device of claim 14 wherein each of the local word lines connects the memory cells of a respective one of the rows with each other and each of the local bit lines connects the memory cells of a respective one of the columns with each other.

16. The device of claim 14 wherein each of the memory cells includes a floating gate, a control gate, and a drain and source incorporated in a semiconductor material, the control gate being a conductive local word line, the device further comprising:
a second dielectric layer positioned on the control gate, wherein the first conductive line is positioned on the second dielectric layer and above the control gate, and is connected to the drains or sources of a first plurality of the memory cells, and wherein the first dielectric layer is positioned on the first conductive line and above the control gate;
a conductive global word line positioned on the first dielectric layer and above the control gate; and
a third dielectric layer positioned on the global word line and above the control gate; wherein the second conductive line is positioned on the third dielectric layer and above the control gate.

* * * * *

UNITED STATES PATENT AND TRADEMARK OFFICE
CERTIFICATE OF CORRECTION

PATENT NO.   : 6,351,413 B1
DATED        : February 26, 2002
INVENTOR(S)  : Rino Micheloni et al.

It is certified that error appears in the above-identified patent and that said Letters Patent is hereby corrected as shown below:

<u>Title page,</u>
Item [73], the assignee should read -- STMicroelectronics S.r.l. --

Signed and Sealed this

Twenty-fourth Day of September, 2002

Attest:

Attesting Officer

JAMES E. ROGAN
*Director of the United States Patent and Trademark Office*